(12) United States Patent
Gopi et al.

(10) Patent No.: US 10,323,322 B2
(45) Date of Patent: Jun. 18, 2019

(54) GAS INLET ELEMENT OF A CVD REACTOR WITH WEIGHT-REDUCED GAS OUTLET PLATE

(71) Applicant: AIXTRON SE, Herzogenrath (DE)

(72) Inventors: Baskar Pagadala Gopi, Aachen (DE); Michael Long, Herzogenrath-Kohlscheid (DE); Markus Gersdorff, Herzogenrath (DE)

(73) Assignee: AIXTRON SE, Herzogenrath (DE)

( * ) Notice: Subject to any disclaimer, the term of this patent is extended or adjusted under 35 U.S.C. 154(b) by 352 days.

(21) Appl. No.: 15/109,793

(22) PCT Filed: Dec. 17, 2014

(86) PCT No.: PCT/EP2014/078262
§ 371 (c)(1),
(2) Date: Jul. 5, 2016

(87) PCT Pub. No.: WO2015/104155
PCT Pub. Date: Jul. 16, 2015

(65) Prior Publication Data
US 2016/0326644 A1   Nov. 10, 2016

(30) Foreign Application Priority Data

Jan. 10, 2014  (DE) .................. 10 2014 100 252
Dec. 16, 2014  (DE) .................. 10 2014 118 704

(51) Int. Cl.
*C23C 16/455*  (2006.01)
*C23C 14/24*  (2006.01)
(Continued)

(52) U.S. Cl.
CPC ............ *C23C 16/455* (2013.01); *C23C 16/06* (2013.01); *C23C 16/22* (2013.01);
(Continued)

(58) Field of Classification Search
CPC ....... C23C 16/455; C23C 16/22; C23C 16/06; C23C 16/45565; C23C 14/24;
(Continued)

(56) References Cited

U.S. PATENT DOCUMENTS 4,123,989 A * 11/1978 Jewett ................... C01B 33/02
                                                          118/724
5,248,253 A *  9/1993 Philipossian ......... C23C 16/455
                                                          432/152
(Continued)

FOREIGN PATENT DOCUMENTS

DE        10211442 A1    9/2003
DE    102006018515 A1   10/2007
(Continued)

OTHER PUBLICATIONS

International Search Report dated Feb. 25, 2015, from the ISA/European Patent Office, for International Patent Application No. PCT/EP2014/078262 (filed Dec. 17, 2014), 5 pages.
(Continued)

*Primary Examiner* — Rudy Zervigon
(74) *Attorney, Agent, or Firm* — Ascenda Law Group, PC

(57) ABSTRACT

A device for carrying out a CVD process comprises a gas inlet element, which is arranged in a reactor housing and has a gas outlet plate, which faces a process chamber, comprises a porous material and has a multiplicity of gas outlet openings, which are fed with process gases from a gas distributing volume arranged in the gas inlet element. In order to improve production aspects of a gas inlet element, in particular for a CVD reactor with a large coating area, it is proposed that the porous material forms the core of the gas outlet plate, the surface segments of which that come into contact with the process gas are sealed.

15 Claims, 3 Drawing Sheets

(51) Int. Cl.
  *C23C 16/22* (2006.01)
  *H01J 37/32* (2006.01)
  *C23C 16/06* (2006.01)
(52) U.S. Cl.
  CPC .... *C23C 16/45565* (2013.01); *H01J 37/3244* (2013.01); *H01J 37/32449* (2013.01)
(58) Field of Classification Search
  CPC ..... C23C 14/243; C23C 14/56; C23C 14/562; C23C 14/568; C23C 16/4485; C23C 16/45548; C23C 16/45551; C23C 16/54; C23C 16/545; H01J 37/32449; H01J 37/3244
  USPC ........................ 118/715; 156/345.33, 345.34
  See application file for complete search history.

(56) References Cited

U.S. PATENT DOCUMENTS

2008/0196666 A1   8/2008  Toshima
2009/0263961 A1*  10/2009  Kher ............... H01L 21/823857
                                                        438/591

FOREIGN PATENT DOCUMENTS

EP       1869691   A1   12/2007
EP       1869691   B1   12/2009
WO   2012/175124   A1   12/2012

OTHER PUBLICATIONS

Written Opinion dated Feb. 25, 2015, from the ISA/European Patent Office, for International Patent Application No. PCT/EP2014/078262 (filed Dec. 17, 2014), 13 pages.

International Preliminary Report on Patentability dated Jul. 12, 2016, from the International Bureau of WIPO, for International Patent Application No. PCT/EP2014/078262 (filed Dec. 17, 2014), 13 pages.

International Search Report dated Feb. 25, 2015, by European Patent Office, for PCT/EP2014/078262 (filed Dec. 17, 2014), w/English translation, 5 pgs.

Written Opinion dated Feb. 25, 2015, by European Patent Office, for PCT/EP2014/078262 (filed Dec. 17, 2014), 6 pgs.

* cited by examiner

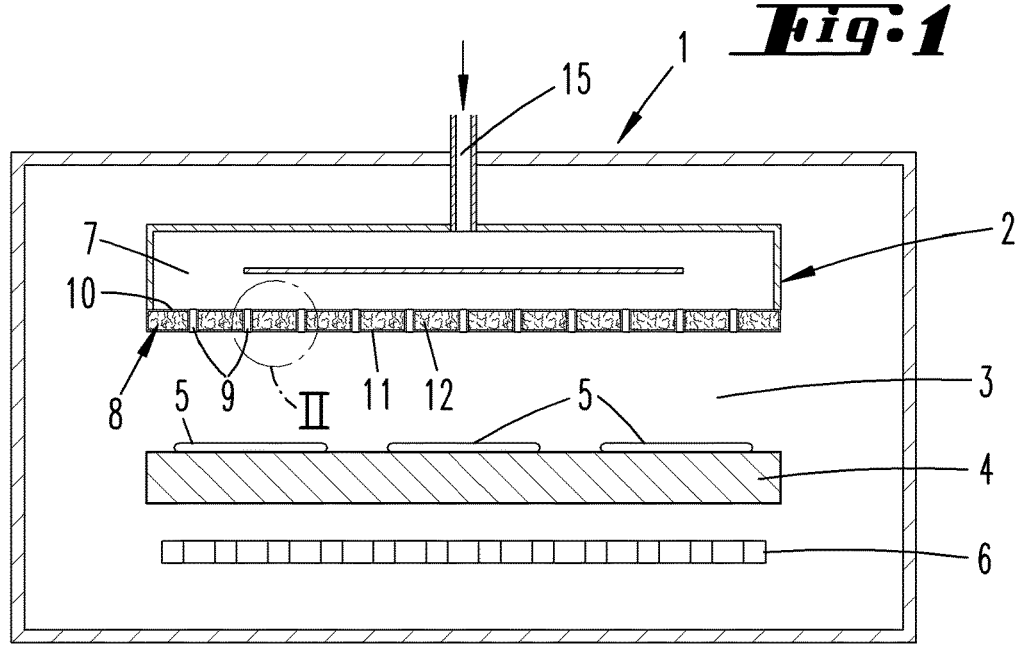
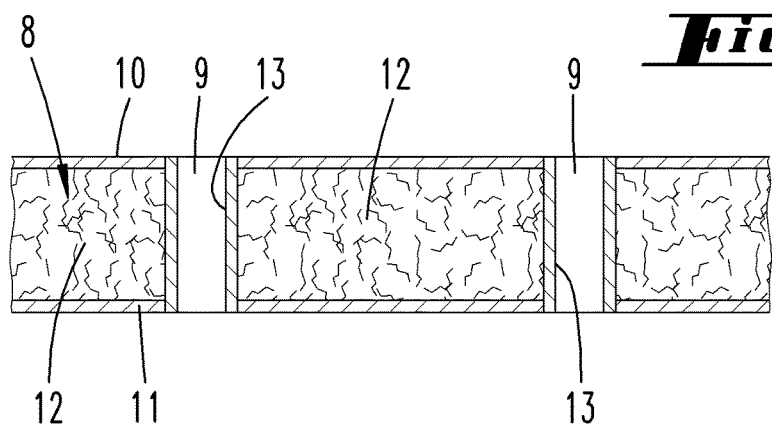
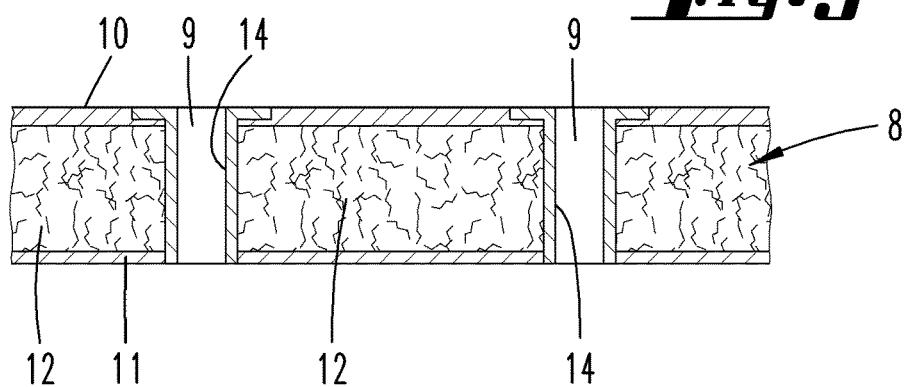

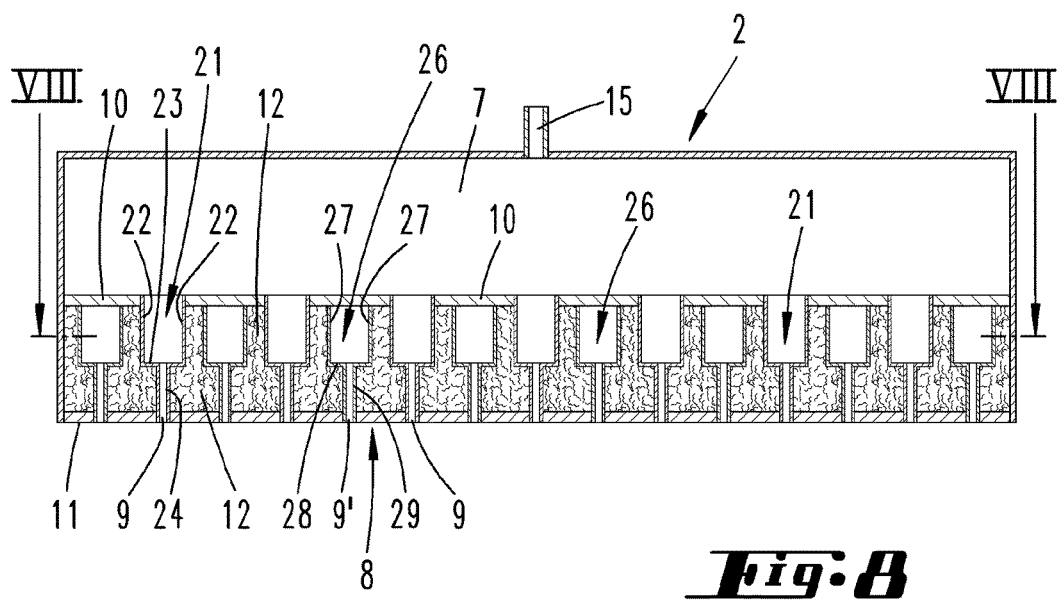
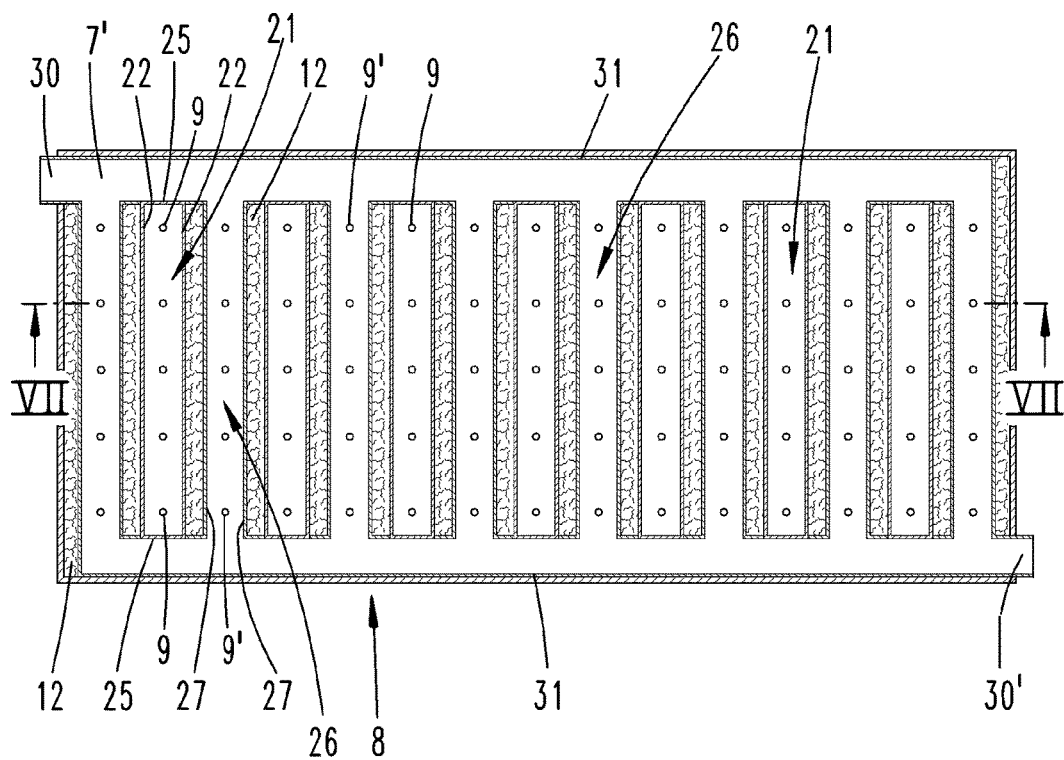

GAS INLET ELEMENT OF A CVD REACTOR WITH WEIGHT-REDUCED GAS OUTLET PLATE

RELATED APPLICATIONS

This application is a National Stage under 35 USC 371 of and claims priority to International Application No. PCT/EP2014/078262, filed 17 Dec. 2014, which claims the priority benefit of DE Application No. 10 2014 100 252.0, filed 10 Jan. 2014, and DE Application No. 10 2014 118 704.0 filed 16 Dec. 2014.

FIELD OF THE INVENTION

The invention relates to a device for carrying out a chemical vapor deposition (CVD) process comprising a gas inlet element which is arranged in a reactor housing and comprises a gas outlet plate facing a process chamber, which gas outlet plate comprises a porous material and a multiplicity of gas outlet openings, which are fed with process gases from a gas distributing volume arranged in the gas inlet element.

BACKGROUND

A CVD reactor is known from DE 10 2006 018 515 A1, wherein the lowest plate of a gas inlet element, said lowest plate facing the process chamber, is constituted for the admission of process gases into the process chamber from a porous body. A water-cooled lower wall of the gas outlet element is located above the porous body.

WO 2012/175124 describes a process gas source for a CVD reactor, wherein a solid foam is used.

EP 1 869 691 B1 describes, in the same way as DE 102 11 442 A1, a solid foam which acts as a diffuser and which is used in a gas inlet element.

SUMMARY OF THE INVENTION

The problem underlying the invention is to improve production aspects of a gas inlet element, in particular for a CVD reactor with a large coating area.

This problem is solved by the invention specified in the claims.

In the first place, and in essence, it is proposed that the gas outlet plate comprises a porous core, the surface segments whereof coming into contact with the process gas are sealed. The sealing of the surface can be a coating. The coating can be made of a ceramic or a metallic material. The coating can be constituted by a thin plate deposited on the broad side face of the gas outlet plate. In particular, the two broad side faces of the porous body constituting the core, said two broad side faces pointing away from one other, are each coated with a gas-tight thin plate or film. The walls of the gas outlet openings are also sealed in this way. The effect of the sealing is that the pores of the porous body are closed in the region of the sealing. As a result of this embodiment, a gas outlet plate is created which has a much lower weight than conventional gas outlet plates made of solid material. One broad side face of the gas outlet plate points directly towards the process chamber. It forms a process chamber roof. The opposite broad side of the gas outlet plate points towards the gas inlet element and can in particular form a wall of a gas distributing volume inside the gas inlet element or the wall of a cooling chamber inside the gas inlet element. A gas outlet plate thus produced counteracts the effect whereby large-area gas outlet plates have a tendency to become deformed downwards under the effect of gravity. The "sandwich design" of the gas outlet plate according to the invention, wherein a lightweight foam body is used, prevents sagging of the gas outlet plate in the central region. The coating can be applied by means of a ceramic adhesive on the two broad sides of the porous base body. The coating of the walls of the gas outlet openings can be formed by sleeves. For this purpose, a multiplicity of holes are drilled in the gas outlet plate after a porous core has been sealed on both sides, into which holes sleeves of metal or ceramic are inserted. The connection can also take place here with a ceramic adhesive. The two layers each sealing a broad side are preferably made from the same material. The sealing can take place in such a way that no process gases can penetrate into the cavities of the porous core. Provision is however also made not to seal regions of the surface of the porous body in a targeted manner, in order that a pressure equalisation can take place when the device is used in a vacuum process. In particular, provision is made such that narrow sides running along the outline contour of the gas outlet plate are not sealed or comprise non-sealed segments, so that gas can enter into the porous body and exit therefrom. The material of the core preferably comprises a solid foam. It can be made of carbon, for example graphite, but it can also be made from a ceramic material, for example silicon carbide. The porous body is heat-resistant and open-pored. It has a porosity of approx. 100 pores per inch. The pores run irregularly through the solid body. They form a net-like structure. The solid foam, which forms the core of the gas outlet plate, can be electrically conductive. This is particularly advantageous when the gas outlet plate is to be tempered. Electrodes in the form of contact areas can be provided on the gas outlet plate, by means of which electrodes a voltage can be applied to the gas outlet plate, so that a current can flow through the gas outlet plate. This leads to heating of the gas outlet plate. The contact areas can be constituted by the broad side coatings. The latter are then made from an electrically conductive material and are not connected to one another. The coating of the narrow sides can then take place from a non-conductive, for example ceramic material. The contact areas can however also be assigned to the narrow sides. In this case, the broad side coatings are made of non-electrically conductive material or poorly electrically conductive material, for example a ceramic material. The sealing can take place under vacuum conditions, in such a way that all the surface segments of the solid foam are sealed. The effect of this is that no pressure can build up inside the solid foam when a gas inlet element equipped according to the invention is used under vacuum conditions. The coating can take place by applying a solid, for example a film, by using sleeves or like structure. Provision is however also made for the coating to be carried out by electroplating, for example applied in an electroplating bath or by means of a CVD process. CVD sealing of the porous core takes place in particular by depositing a silicon carbide layer on a silicon carbide solid foam. According to a variant of the invention, provision is made such that the gas inlet element comprises a gas outlet plate, which comprises gas outlet openings through which process gases differing from one another can enter into a process chamber. A plurality of gas outlet openings is assigned in each case to different gas distributing volumes. Different gas distributing volumes then feed different gas outlet openings. Gas distributing channels are also provided, each of which feeds a plurality of gas outlet openings. The gas distributing channels preferably run inside the gas outlet plate. Two gas distributing volumes not connected to one another in terms of flow can be provided, which are fed by separate supply lines. Each gas distributing volume feeds a multiplicity of gas outlet openings. The gas outlet openings, which belong to different gas distributing volumes, can be arranged beside one another in the form of a row. One row can be assigned in each case to a gas distributing channel. Pipes can lead away from the bottom face of the gas distributing channels, said pipes emerging into a gas outlet area of the gas outlet plate. The gas distributing volume can preferably be arranged completely inside the volume of the gas outlet plate. This volume extends between the two broad side faces of the gas outlet plate. The gas distributing volume can be constituted by a plurality of gas distributing channels arranged in a comb-shaped or grid-shaped manner. Between the aforementioned gas distributing channels, there can run gas distributing channels which are connected in terms of flow to a gas distributing volume arranged above the gas outlet plate. The gas distributing channels can be constituted as open channels, the bottoms whereof can be connected via pipes to the gas outlet area. The gas distributing channels can however also be constituted as closed channels, for example the channels can be closed by a metal layer. The material of the porous core is located between adjacent gas distributing channels.

BRIEF DESCRIPTION OF THE DRAWINGS

Examples of embodiments of the invention are explained below with the aid of the appended drawings. In the figures:

FIG. 1 shows a cross-sectional representation through the housing of a CVD reactor, wherein only the main functional elements are represented diagrammatically, FIG. 2 shows detail II from FIG. 1 of a first example of embodiment, FIG. 3 shows a representation according to FIG. 2 of a second of embodiment, FIG. 7 shows a cross-section through a gas outlet element 2 of a fifth embodiment along line VII-VII in FIG. 8, and FIG. 8 shows the cross-section along line VIII-VIII in FIG. 7.

DETAILED DESCRIPTION OF THE INVENTION

Figure 4:
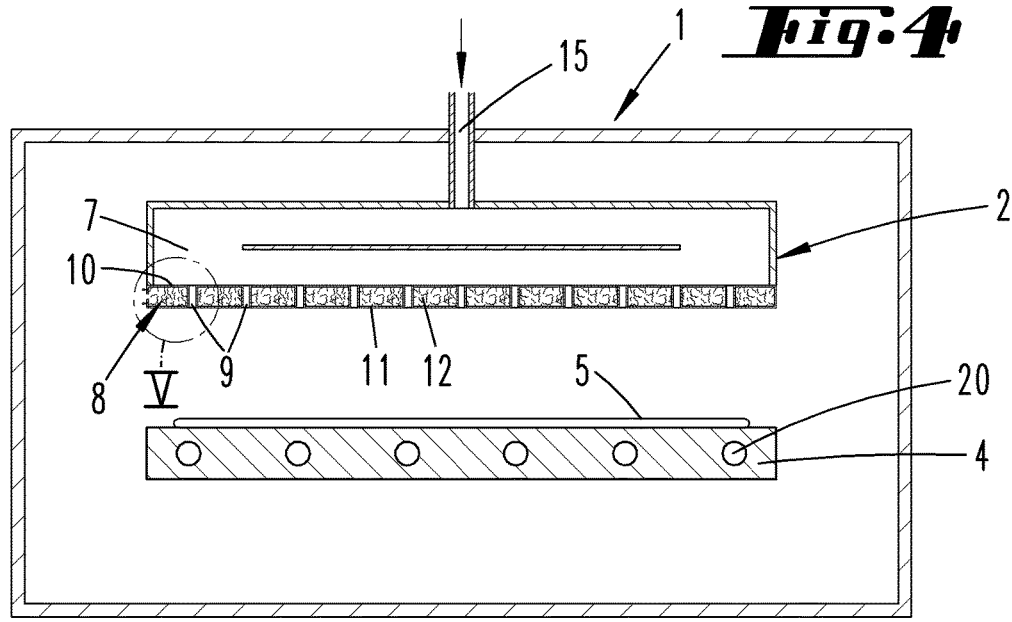
FIG. 4 shows a representation according to FIG. 1 of a third embodiment.

The CVD reactor depicted in FIG. 1 comprises a housing 1, which seals the interior of the housing in a gas-tight manner with respect to the surroundings. A gas inlet element 2 is located inside housing 1. Gas inlet element 2 is a body which forms a hollow space. The hollow space forms a gas distributing volume 7, which is fed with process gases from the exterior through a supply line 15. Only one gas distributing volume 7 is depicted in FIG. 1. In an embodiment not depicted, a plurality of gas distributing volumes may be present, which are separated from one another and into which different process gases can be fed through corresponding supply lines.

Gas inlet element 2 comprises a gas outlet plate 8. Gas outlet plate 8 comprises a multiplicity of gas outlet openings 9, which are arranged in the manner of a showerhead. The process gas fed into gas distributing volume 7 can exit through gas outlet openings 9. Gas distributing volume 7 thus feeds a multiplicity of gas outlet openings 9 arranged in particular on grid points.

If a plurality of gas distributing volumes is provided, each gas distributing volume is connected to gas outlet openings 9 assigned individually to the respective gas distributing volume, through which gas outlet openings the process gas can flow into a process chamber 3 arranged beneath gas inlet element 2.

In an embodiment not depicted, a cooling chamber is provided directly above gas outlet plate 8, through which cooling chamber a coolant, for example water, can flow. In the case of such an embodiment, the broad side face of gas outlet plate 8 that is facing gas inlet element 2 forms the wall of a cooling chamber.

In the embodiment depicted in FIG. 1, the wall of gas outlet plate 8 that is facing gas inlet element 2 forms an inner wall of gas distributing volume 7.

Located inside gas distributing volume 7 are gas baffle plates, which are required for a uniform distribution of the gas and for a uniform formation of a gas outlet flow from gas outlet openings 9.

Gas outlet plate 8 extends in a horizontal plane. Located in a horizontal plane, which is arranged beneath gas outlet plate 8, is a susceptor 4, which can be made of graphite, in particular coated graphite, molybdenum or another suitable material. Substrates 5 to be coated lie on susceptor 4.

Located beneath susceptor 4 is a heater 6. It can be a resistance heater or an RF heater. Susceptor 4 is heated by this heater 6 to a process temperature at which the process gases introduced from gas outlet openings 9 into process chamber 3 can be pyrolytically decomposed or can react with one another, so that a thin, homogeneous layer can be deposited on substrates 5.

FIG. 4, like FIG. 1, shows purely diagrammatically the structure of an organic vapor phase deposition (OVPD) reactor with a housing 1, a gas inlet element 2 arranged therein and a susceptor 4 for accommodating one or more substrates 5 to be coated. In the OVPD system, organic layers are deposited to produce organic light emitting diode (OLED) displays. This essentially takes place in a condensation process, wherein substrate 5 lies on a cooled susceptor 4. For this purpose, susceptor 4 comprises a cooling chamber, for example in the form of cooling channels 20, through which a liquid cooling medium flows through susceptor 4. Gas inlet element 2 is heated in this instant embodiment. In particular, provision is made such that gas outlet plate 8 is resistance-heated. For this purpose, it can be made from an electrically conductive material through which an electrical current can be conducted.

Gas outlet plate 8 is connected only at its edge to gas inlet element 2 in some of the embodiments. In order to prevent the central region of gas outlet plate 8 from sagging downwards, gas outlet plate 8 according to the invention is produced in a lightweight construction technique. It comprises a core having a low density, the surface segments whereof coming into contact with the process gas are sealed, the sealing being carried out in such a way that a continuous surface is formed from the material used for the sealing. In some embodiments, the two broad sides 10, 11 pointing away from one another are sealed throughout. Moreover, the walls of gas outlet openings 9 are provided with a sealing layer 13.

The base area of susceptor 4, which is identical to the base area of gas outlet plate 8, can amount to several square meters. The base areas of susceptor 4 and gas outlet plate 8 can be circular, or polygonal, for example square.

In the embodiments depicted in FIGS. 2, 3, 5 and 6, gas outlet plate 8 comprises a core 12, which is produced from a heat-resistant porous material. It involves here a solid foam with a pore density of approx. 100 pores per inch. Solid foams can be used which have a pore density of 50 to 200 pores per inch. It involves an open-pore solid foam, which is made of silicon carbide or graphite. The solid foam can however also be made of another suitable ceramic material or a metal. Coatings 10, 11, and 13 can be produced by CVD coating. For example, the foam body surface can be coated with silicon carbide or a metal in a CVD process in such a way that the pores are closed. This CVD process preferably takes place under vacuum conditions.

In the embodiment depicted in FIG. 2, thin plates have been used to form sealing layers 10, 11. It can be metal plates, but also ceramic plates. The plates are connected to porous body 12 by a ceramic, heat-resistant adhesive.

The gas outlet openings are produced by drilling. The walls of the bores are then sealed with a sealing material, for example a metal layer 13.

In the second embodiment depicted in FIG. 3, the broad side faces of core 12 made of porous material are each coated with thin layers 10, 11, which are a few microns thick. The layers can be a film material. Layers 10, 11 can however also be deposited by electroplating or in a CVD process. The layers can be up to a micron thick. The total area of a gas outlet plate can be up to 5 m² or more.

Here too, gas outlet openings 9 are constituted by bores, which are produced after the two broad side faces of foam body 12 have been sealed. Sleeves 14 are then inserted into the prefabricated bores. The sleeves can comprise a radially outwardly pointing collar. The sleeve ends are connected, for example by a ceramic adhesive, to the end face seals, so that a gas-tight connection arises.

The sealing takes place under vacuum conditions. In particular, provision is made such that all surface segments of gas outlet plate 8 are sealed, so that the foam body interior is sealed in a gas-tight manner to the exterior. No gas from the exterior can thus enter into the pores of the porous core. Provision is however also made such that, in a targeted manner, surface segments of gas outlet plate 8 are not sealed, so that a pressure equalisation can take place through the non-sealed region. It is thus possible that gas can enter into gas outlet plate 8 or can exit from gas outlet plate 8 in the event of a pressure change.

Figure 5:
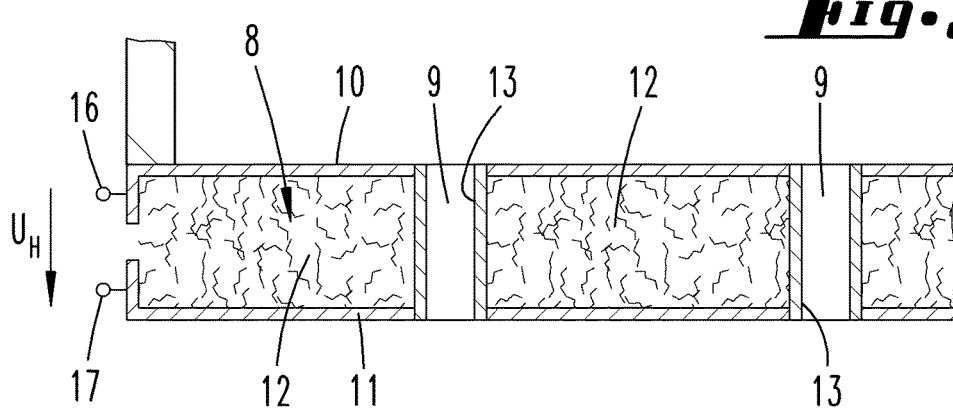
FIG. 5 shows detail V in FIG. 4.
Figure 6:
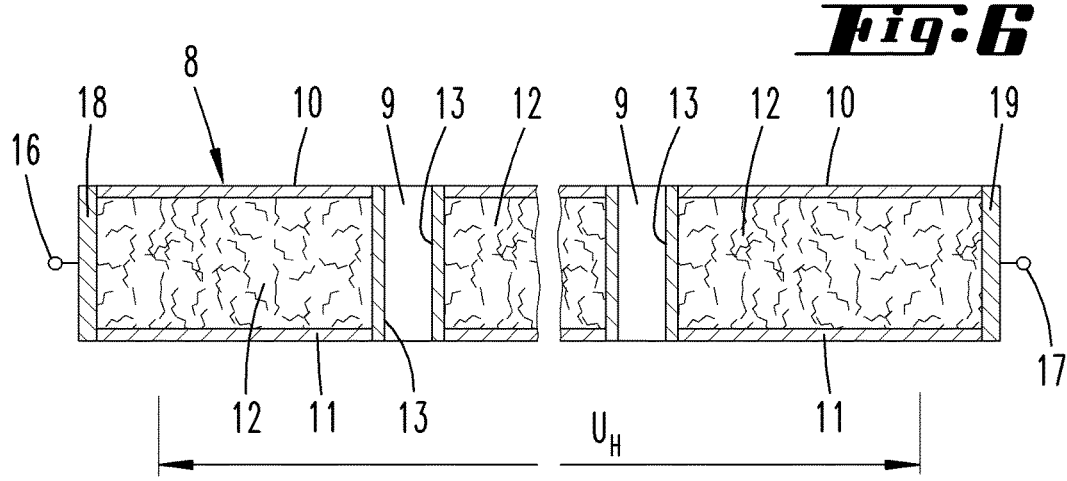
FIG. 6 shows a representation according to FIG. 2 of a fourth embodiment.

The embodiment shown in FIGS. 5 and 6 show gas outlet plates 8, which can be heated with the aid of an electric current. In the embodiment depicted in FIG. 5, the two broad side faces 10, 11 are made from an electrically conductive material, for example metal. The two mutually opposite broad side coatings 11, 12 thus form contact areas. They are galvanically separated from one another. Broad side coating 10 is connected to a terminal contact 16 and broad side coating 11 to a terminal contact 17. A heating voltage $U_H$ can be applied to both terminal contacts 16, 17. This leads to an electric current through the gas outlet plate 8 made for example from a graphite foam, in order to heat the latter.

In the embodiment depicted in FIG. 6, the two broad side coatings 10, 11 are produced from a non-conductive material, for example from a ceramic material. Contact areas 18, 19 of metal are deposited on two mutually opposite narrow side faces. Contact areas 18, 19 extend essentially over the entire length of the respective narrow side. Contact areas 18, 19 are provided with terminal contacts 16, 17, so that a heating voltage $U_H$ can be applied to gas outlet plate 8. This leads to a current flowing through gas outlet plate 8 and to heating of gas outlet plate 8.

In the fifth embodiment depicted in FIGS. 7 and 8, gas inlet element 2 comprises supply lines 15, 30 not connected to one another in terms of flow. A supply line 15 feeds a gas distributing volume 7 arranged above gas outlet plate 8. This gas distributing volume 7 is connected to groove-shaped gas distributing channels 21, which extend inside gas outlet plate 8. The depth of gas distributing channels 21 can also be zero, so that side walls 22 of gas distributing channels 21 have zero height and bottom 23 of gas distributing channel 21 terminates flush with metal layer 10, which isolates porous core 12 with respect to gas volume 7. In the embodiment that is depicted, gas distributing channels 21 extend roughly over half the material thickness of gas outlet plate 8, the material thickness whereof is essentially formed by porous core 12 and broad side faces 10, 11 whereof comprise a metal layer.

Gas distributing channels 26 closed with respect to gas distributing volume 7 extend in each case between two gas distributing channels 21 extending over the entire width of gas inlet element 2. Whereas gas distributing channels 21 are closed at the end with a narrow wall 25, all gas distributing channels 26 are connected to one another with their narrow-side ends. This takes place via transverse channels which run along outer wall 31 of gas inlet element 2. The channel system forms a second gas distributing volume 7', which is fed with a process gas through a supply line 30 and respectively 30'. Gas distributing channels 21, 26 having a rectangular cross-section comprise two side walls 22, 27 spaced apart from one another, which run in parallel with one another and in parallel with side walls 27, 22 of respective other gas distributing channels 26, 21. Gas distributing channels 21, 26 form bottom faces 23, 28, which are each connected by a multiplicity of pipes 29 to the gas outlet area of the gas outlet plate.

Gas outlet openings 9 arranged in the form of a row are thus connected in terms of flow to gas distributing channels 21 and gas outlet openings 9' to gas distributing channels 26. Here too, gas outlet plate 8 comprises a core made of a porous material and only broad side faces 10, 11 comprise metal plates.

In the embodiment depicted in FIGS. 7 and 8, two gas distributing channels 26, 21 connected to different gas distributing volumes alternate with one another. Provision is however also made such that three or more gas distributing channels connected in each case to different gas distributing volumes alternate with one another, so that not only two different gases can be conveyed into the process chamber through different gas outlet openings 9, 9', but more than two different process gases in each case through their individually assigned gas outlet openings.

The above comments serve to explain the inventions covered as a whole by the application, said inventions developing further the prior art at least by the following combinations of features in each case independently, i.e.:

A device which is characterised in that the porous material forms core 12 of gas outlet plate 8, the surface segments whereof coming into contact with the process gas are sealed.

A device which is characterised in that the surface segments coming into contact with the process gas are sealed by a coating, in particular a ceramic or metallic layer.

A device which is characterised in that the two broad side faces 10, 11 of gas outlet plate 8 pointing away from one another are sealed in such a way that the pores of core 12 are closed.

A device which is characterised in that walls 13 of gas outlet opening 9 formed by bores are sealed in such a way that the pores of core 12 of gas outlet plate 8 are closed, or that surface segments of core 12 of gas outlet plate 8 are not sealed, so that gas can enter into gas outlet plate 8 and exit therefrom in the event of a pressure change.

A device which is characterised in that the material of core 12 is a solid foam, in particular made of carbon, graphite or silicon carbide or metal, or that core 12 is produced from a heat-resistant material.

A device which is characterised in that core 12 comprises contact areas 10, 11; 18, 19 made of an electrically conductive material, which are connected to terminal contacts 16, 17, at which an electrical heating voltage $U_H$ can be applied in order to heat gas inlet element 2.

A device which is characterised in that core 12 is an open-pore solid foam with a porosity of one hundred pores per inch.

A device which is characterised in that the walls of gas outlet openings 9, 9' are constituted by sleeves 14 or pipes 24, 29 inserted into bores.

A device which is characterised in that, of the two sealed broad sides of gas outlet plate 8, a downwardly pointing broad side face 11 forms the roof of process chamber 3 and an upwardly pointing broad side face 10 forms the wall of a gas distributing volume 7.

A device which is characterised by gas distributing channels 21, 26 running in gas outlet plate 8 and in each case feeding a plurality of gas outlet openings 9, 9'.

A device which is characterised in that at least two gas distributing volumes 7, 7', which are not connected to one another in terms of flow and which are fed by separate supply lines 15, 30, are connected in terms of flow to different gas outlet openings 9, 9'.

A device which is characterised in that gas distributing channels 21, 26 arranged directly beside one another are assigned to different gas distributing volumes 7, 7', so that different process gases can be fed separately from one another into the process chamber.

A device which is characterised in that a gas distributing volume 7' is arranged inside the volume of gas outlet plate 8 bordered by broad side faces 10, 11 of gas outlet plate 8.

All the disclosed features are essential to the invention (in themselves, but also in combination with one another). The disclosure content of the associated/appended priority documents (copy of prior application) are thus also included in their entire contents in the disclosure of the application, including for the purpose of adopting features of these documents in claims of the present application. The subclaims characterise with their features independent inventive developments of the prior art, in particular so that divisional applications can be made on the basis of these claims.

| List of reference numbers | |
|---|---|
| 1 | Reactor housing |
| 2 | Gas inlet element |
| 3 | Process chamber |
| 4 | Susceptor |
| 5 | Substrate |
| 6 | Heater |
| 7, 7' | Gas distributing volume |
| 8 | Gas outlet plate |
| 9, 9' | Gas outlet opening |
| 10 | Broad side (face) coating |
| 11 | Broad side (face) coating |
| 12 | Core, body |
| 13 | Walls, (sealing) layer |
| 14 | Sleeve |
| 15 | Supply line |
| 16 | Terminal contact |
| 17 | Terminal contact |
| 18 | Contact area |
| 19 | Contact area |
| 20 | Cooling channels |
| 21 | Gas distributing channel |
| 22 | Wall |
| 23 | Bottom |
| 24 | Pipe |
| 25 | Narrow wall |
| 26 | Gas distributing channel |
| 27 | Wall |
| 28 | Bottom |
| 29 | Pipe |
| 30, 30' | Gas supply line |
| 31 | Wall |
| $U_H$ | Heating voltage |

What is claimed is:

1. A device for carrying out a chemical vapor deposition (CVD) process comprising a gas inlet element (2) which is arranged in a reactor housing (1) and comprises a gas outlet plate (8) facing a process chamber (3), which gas outlet plate (8) comprises a porous material and a multiplicity of gas outlet openings (9), which are fed with process gases from a gas distributing volume (7) arranged in the gas inlet element (2),
   wherein the porous material forms a core (12) of the gas outlet plate (8),
   wherein surface segments of the core (12) coming into contact with the process gases are sealed, and
   wherein walls (13) of the gas outlet openings (9) formed by bores are sealed in such a way that pores of the core (12) of the gas outlet plate (8) are closed.

2. The device according to claim 1, wherein the surface segments of the core (12) coming into contact with the process gases are sealed by a coating.

3. The device according to claim 1, wherein the surface segments of the core (12) coming into contact with the process gases comprise a first broad side face (10) and a second broad side face (11) of the gas outlet plate (8) pointing away from one another.

4. The device according to claim 1, wherein the porous material of the core (12) is a solid foam, made of one of carbon, graphite, silicon carbide, or metal.

5. The device according to claim 1, characterized in that the core (12) is electrically conductive and carries contact areas (10, 11; 18, 19) made of an electrically conductive material, which are connected to terminal contacts (16, 17), at which an electrical heating voltage ($U_H$) can be applied in order to heat the gas inlet element (2).

6. The device according to claim 1, wherein the core (12) is an open-pore solid foam.

7. The device according to claim 1, characterized in that the walls of the gas outlet openings (9, 9') are constituted by one of sleeves (14) or pipes (24, 29) inserted into bores.

8. The device according to claim 3, wherein the second broad side face (11) forms a roof of the process chamber (3) and the first broad side face (10) forms a wall of a gas distributing volume (7).

9. The device according to claim 1, characterized by gas distributing channels (21, 26) running in the gas outlet plate (8) and in each case feeding the multiplicity of gas outlet openings (9, 9').

10. The device according to claim 1, characterized in that at least two gas distributing volumes (7, 7'), which are not connected to one another in terms of flow and which are fed by separate supply lines (15, 30), are connected in terms of flow to different ones of the multiplicity of gas outlet openings (9, 9').

11. The device according to claim 1, characterized in that gas distributing channels (21, 26) extending over an entire length of the gas inlet element (2) are arranged beside one another in a row.

12. The device according to claim 1, characterized in that gas distributing channels (21, 26) arranged directly beside one another are assigned to different gas distributing volumes (7, 7'), so that different process gases can be fed separate from one another into the process chamber.

13. The device according to claim 1, characterized in that a gas distributing volume (7') is arranged inside the gas outlet plate (8) bordered by broad side faces (10, 11) of the gas outlet plate (8).

14. The device according to claim 2, wherein the coating is one of a ceramic or a metallic layer.

15. The device according to claim 1, wherein the core (12) is produced from a fire-resistant material.

* * * * *